United States Patent
Lee et al.

(10) Patent No.: US 7,145,409 B2
(45) Date of Patent: Dec. 5, 2006

(54) LOW POWER QUADRATURE VOLTAGE CONTROLLED OSCILLATOR USING BACK GATE

(75) Inventors: Sang Gug Lee, Daejeon (KR); Hye Ryoung Kim, Daejeon (KR)

(73) Assignee: Information and Communication University and Industrial Cooperation Group, Baejeon (KR)

( * ) Notice: Subject to any disclaimer, the term of this patent is extended or adjusted under 35 U.S.C. 154(b) by 0 days.

(21) Appl. No.: 10/925,669

(22) Filed: Aug. 25, 2004

(65) Prior Publication Data

US 2005/0046494 A1    Mar. 3, 2005

(30) Foreign Application Priority Data

Aug. 25, 2003    (KR) .................. 10-2003-0058741

(51) Int. Cl.
    *H03H 5/12*    (2006.01)
(52) U.S. Cl. ............... 331/117 FE; 331/167
(58) Field of Classification Search ......... 331/117 R, 331/117 FE, 167
    See application file for complete search history.

(56) References Cited

U.S. PATENT DOCUMENTS

| | | | |
|---|---|---|---|
| 6,317,008 B1 * | 11/2001 | Gabara ............... 331/117 R |
| 6,456,167 B1 * | 9/2002 | Huang ................. 331/46 |
| 6,583,675 B1 * | 6/2003 | Gomez ................ 331/17 |
| 6,650,195 B1 * | 11/2003 | Brunn et al. ......... 331/177 V |
| 6,667,668 B1 * | 12/2003 | Henrion .............. 332/149 |
| 6,867,656 B1 * | 3/2005 | Hajimiri et al. ...... 331/45 |
| 6,906,596 B1 * | 6/2005 | Kitamura et al. ..... 331/36 C |

FOREIGN PATENT DOCUMENTS

| | | |
|---|---|---|
| JP | 2001-345637 | 12/2001 |
| JP | 2002-208819 | 7/2002 |

* cited by examiner

*Primary Examiner*—Robert Pascal
*Assistant Examiner*—James Goodley
(74) *Attorney, Agent, or Firm*—Alston & Bird LLP

(57) ABSTRACT

Disclosed is a quadrature VCO (voltage controlled oscillator) which comprises a first delay cell including a first switching transistor and a second switching transistor, the first delay cell outputting first and second in-phase signals with different phases; and a second delay cell including a third switching transistor and a fourth switching transistor, the second delay cell outputting first and second quadrature-phase signals with different phases. The first and second quadrature-phase signals are applied to back gates of the first and second switching transistors, and the first and second in-phase signals are applied to back gates of the fourth and third switching transistors.

6 Claims, 8 Drawing Sheets

LOW POWER QUADRATURE VOLTAGE CONTROLLED OSCILLATOR USING BACK GATE

CROSS REFERENCE TO RELATED APPLICATION

This application claims priority to and the benefit of Korea Patent Application No. 10-2003-0058741 filed on Aug. 25, 2003 in the Korean Intellectual Property Office, the entire content of which is incorporated herein by reference.

BACKGROUND OF THE INVENTION (a) Field of the Invention

The present invention relates to a quadrature VCO (voltage controlled oscillator.) More specifically, the present invention relates to a low-power quadrature VCO using a back gate of a switching transistor.

(b) Description of the Related Art

A quadrature VCO (voltage controlled oscillator) is a circuit for generating four kinds of signals with the same magnitude but with delays of 90 degrees respectively, and is generally applied to direct conversion transmitters and receivers.

Figure 1:
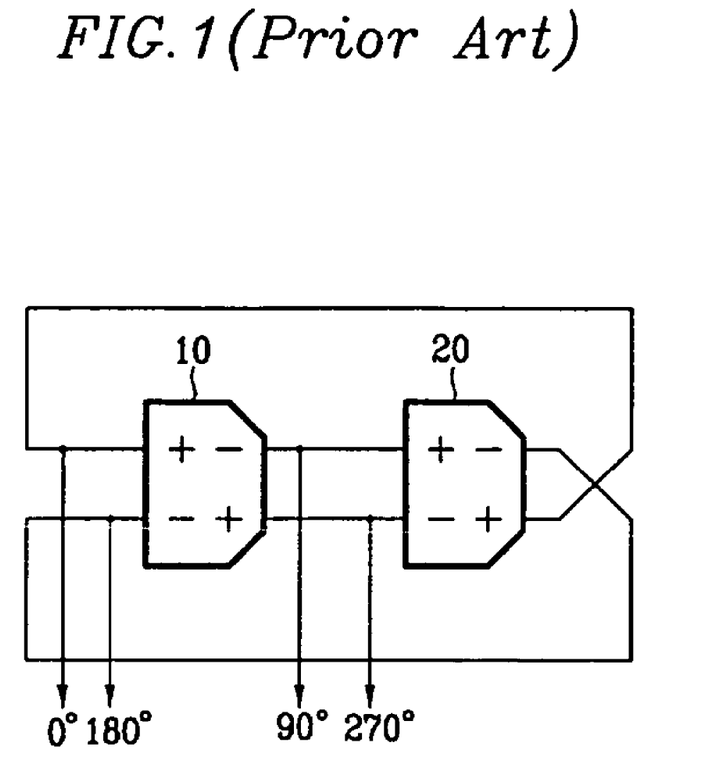
FIG. 1 shows a brief block diagram of a quadrature VCO.

FIG. 1 shows a block diagram of a quadrature VCO.

As shown, the quadrature VCO comprises first and second coupled delay cells 10 and 20.

In detail, signals output by (−) and (+) output terminals of the first delay cell 10 are applied to (+) and (−) input terminals of the second delay cell 20, and signals output by (−) and (+) output terminals of the second delay cell 20 are applied to (−) and (+) input terminals of the first delay cell 10.

According to the above-noted configuration, the (−) and (+) output terminals of the first delay cell 10 output signals with the same magnitude and phases of 90° and 270°, and the (+) and (−) output terminals of the second delay cell 20 output signals with the same magnitude and phases of 0° and 180°.

Figure 2:
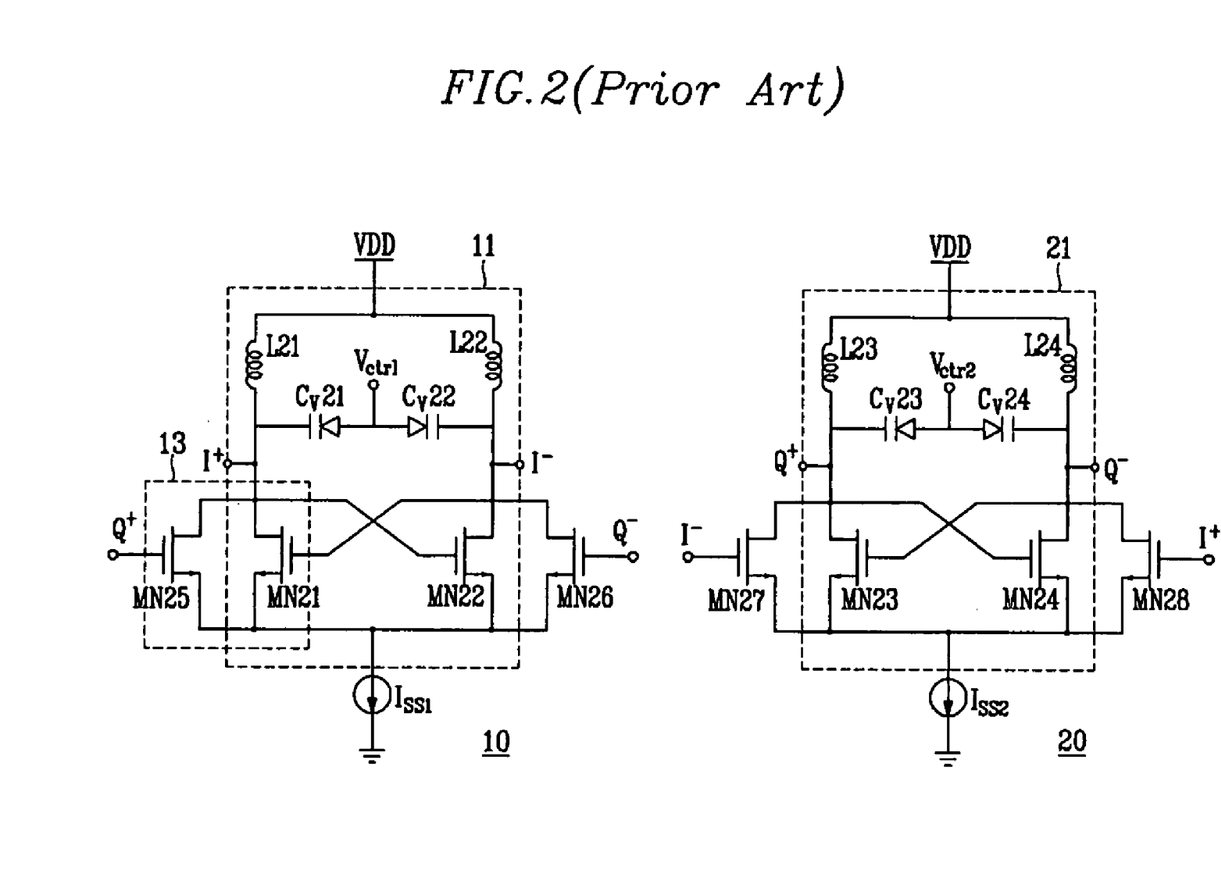
FIG. 2 shows a detailed diagram of a conventional circuit used as the first and second delay cells 10 and 20 in the quadrature VCO of FIG. 1.

FIG. 2 shows a detailed diagram of a conventional circuit used as the first and second delay cells 10 and 20 in the quadrature VCO of FIG. 1.

As shown in FIG. 2, the first and second delay cells 10 and 20 comprise differential VCOs (voltage controlled oscillators) 11 and 21 for varying frequencies of output signals according to control voltages Vctr1 and Vctr2, and first to fourth coupling transistors MN25 to MN28 for coupling the first and second delay cells 10 and 20, the configuration and operation of which will now be described.

The differential VCO 11 of the first delay cell 10 comprises first and second switching transistors MN21 and MN22, first and second inductors L21 and L22, and first and second varactors Cv21 and Cv22, and the differential VCO 21 of the second delay cell 20 comprises third and fourth switching transistors MN23 and MN24, third and fourth inductors L23 and L24, and third and fourth varactors Cv23 and Cv24.

The first to fourth switching transistors MN21 to MN24 generate negative resistance of the differential VCOs 11 and 21, and are cross-coupled.

The first to fourth inductors L21 to L24 and the first to fourth varactors Cv21 to Cv24 form an LC tank, and vary impedance of the LC tank according to the applied control voltages Vctr1 and Vctr2, thereby varying the frequency of output signals.

As shown in FIG. 2, the conventional VCO additionally uses first to fourth coupling transistors MN25 to MN28 in order to couple the first delay cell 10 to the second delay cell 20. The coupling transistors MN25 to MN28 consume additional power which reaches 30 to 100% of power consumption of the switching transistors MN21 to MN24.

Also, since the active elements such as the MOS transistors cause noise, usage of first to fourth coupling transistors MN25 to MN28 deteriorates phase noise characteristics of the whole circuit.

SUMMARY OF THE INVENTION

It is an advantage of the present invention to provide a quadrature VCO for coupling the first and second delay cells without using an additional coupling transistor.

It is another advantage of the present invention to provide a quadrature VCO with less power consumption and improved phase noise characteristics.

In one aspect of the present invention, a quadrature VCO comprises a first delay cell for outputting first and second in-phase signals with difference phases, and a second delay cell for outputting first and second quadrature-phase signals with difference phases, wherein the first delay cell comprises: a first switching transistor including a gate, a source, a drain for outputting the first in-phase signal, and a back gate for receiving the first quadrature-phase signal; a second switching transistor including a gate, a source, a drain for outputting the second in-phase signal, and a back gate for receiving the second quadrature-phase signal, the second switching transistor being cross-coupled to the first switching transistor; a first LC resonance circuit coupled between the drains of the first and second switching transistors and a first power source; and a first current source coupled between a node of the sources of the first and second switching transistors and a second power source, and the second delay cell comprises: a third switching transistor including a gate, a source, a drain for outputting the first quadrature-phase signal, and a back gate for receiving the second in-phase signal; a fourth switching transistor including a gate, a source, a drain for outputting the second quadrature-phase signal, and a back gate for receiving the first in-phase signal, the fourth switching transistor being cross-coupled to the third switching transistor; a second LC resonance circuit coupled between the drains of the third and fourth switching transistors and the first power source; and a second current source coupled between a node of the sources of the third and fourth switching transistors and the second power source.

The quadrature VCO further comprises resistors respectively coupled between the back gates and the sources of the first to fourth switching transistors.

The quadrature VCO further comprises capacitors respectively coupled to the back gates of the first to fourth switching transistors, and the first and second quadrature-phase signals and the second and first in-phase signals are respectively applied to the back gates of the first to fourth switching transistors through the capacitors.

The first LC resonance circuit comprises: first and second inductors respectively coupled between the drains of the first and second switching transistors and the first power source; and first and second varactors each having one terminal respectively coupled to the drains of the first and second switching transistors, and another terminal connected to a control voltage for controlling frequencies of the first and second in-phase signals being applied to a node of the other terminals, and the second LC resonance circuit comprises: third and fourth inductors respectively coupled between the drains of the third and fourth switching transistors and the first power source; and third and fourth varactors each having one terminal respectively coupled to the drains of the third and fourth switching transistors, and another terminal connected to a control voltage for controlling frequencies of the first and second quadrature-phase signals being applied to a node of the other terminals.

In another aspect of the present invention, a quadrature VCO comprises a first delay cell for outputting first and second in-phase signals with different phases, and a second delay cell for outputting first and second quadrature-phase signals with different phases, wherein the first delay cell comprises: a first negative resistance cell for generating negative resistance; a second negative resistance cell comprising a first switching transistor including a gate, a source coupled to a first power source, a drain for outputting the first in-phase signal, and a back gate for receiving the first quadrature-phase signal; and a second switching transistor including a gate, a source, a drain for outputting the second in-phase signal, and a back gate for receiving the second quadrature-phase signal, the second switching transistor being cross-coupled to the first switching transistor; a first LC resonance circuit coupled between the first and second negative resistance cells; and a first current source coupled between the first negative resistance cell and a second power source, and the second delay cell comprises: a third negative resistance cell for generating negative resistance; a fourth negative resistance cell comprising a third switching transistor including a gate, a source coupled to the first power source, a drain for outputting the first quadrature-phase signal, and a back gate for receiving the second in-phase signal; and a fourth switching transistor including a gate, a source, a drain for outputting the second quadrature-phase signal, and a back gate for receiving the first in-phase signal; a second LC resonance circuit coupled between the third and fourth negative resistance cells; and a second current source coupled between the third negative resistance cell and the second power source.

The quadrature VCO further comprises resistors respectively coupled between the back gates and the sources of the first to fourth switching transistors.

The quadrature VCO further comprises capacitors respectively coupled to the back gates of the first to fourth switching transistors, and the first and second quadrature-phase signals and the second and first in-phase signals are respectively applied to the back gates of the first to fourth switching transistors through the capacitors.

In still another aspect of the present invention, a quadrature VCO comprises: a first delay cell including first and second switching transistors, the first delay cell outputting first and second in-phase signals with different phases; and a second delay cell including third and fourth switching transistors, the second delay cell outputting first and second quadrature-phase signals with different phases, and wherein the first and second quadrature-phase signals are applied to back gates of the first and second switching transistors, and the first and second in-phase signals are applied to back gates of the fourth and third switching transistors.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 5b shows a signal equivalent circuit diagram of the coupled portion 13 shown in FIG. 5a;

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 3A:
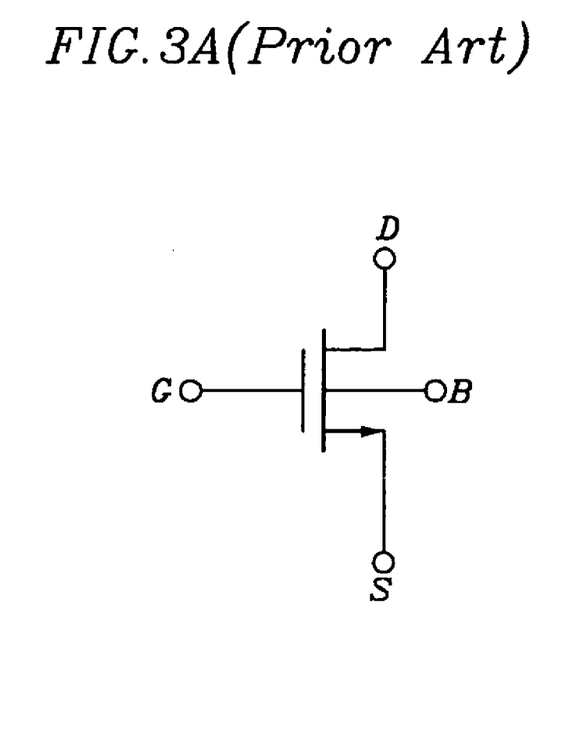
FIG. 3a shows a MOS element.
Figure 3B:
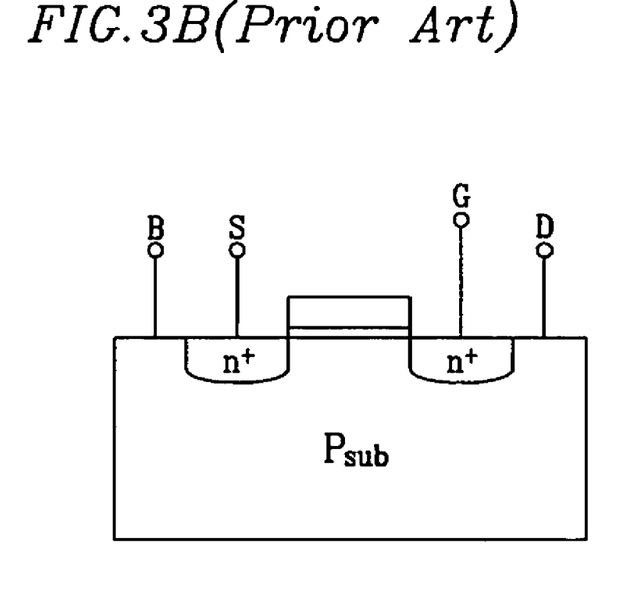
FIG. 3b shows a MOS element.

A quadrature VCO according to a preferred embodiment of the present invention utilizes a MOS element which comprises a gate terminal G, a drain terminal D, a source terminal S, and a body terminal B as shown in FIGS. 3a and 3b. In most circuits which use the MOS elements, the gate terminal G, the drain terminal D, and the source terminal S are used as signal terminals by coupling the body terminal B to the source terminal S or grounding the body terminal B. The body terminal B is generally referred to as a back gate since voltage variation of Vbs between the body terminal B and the source terminal S affects current variation at the drain terminal D and the body terminal B functions as another gate.

In the preferred embodiment, the body terminal B which performs a gate function, that is, the back gate, is used as an independent terminal.

Figure 4:
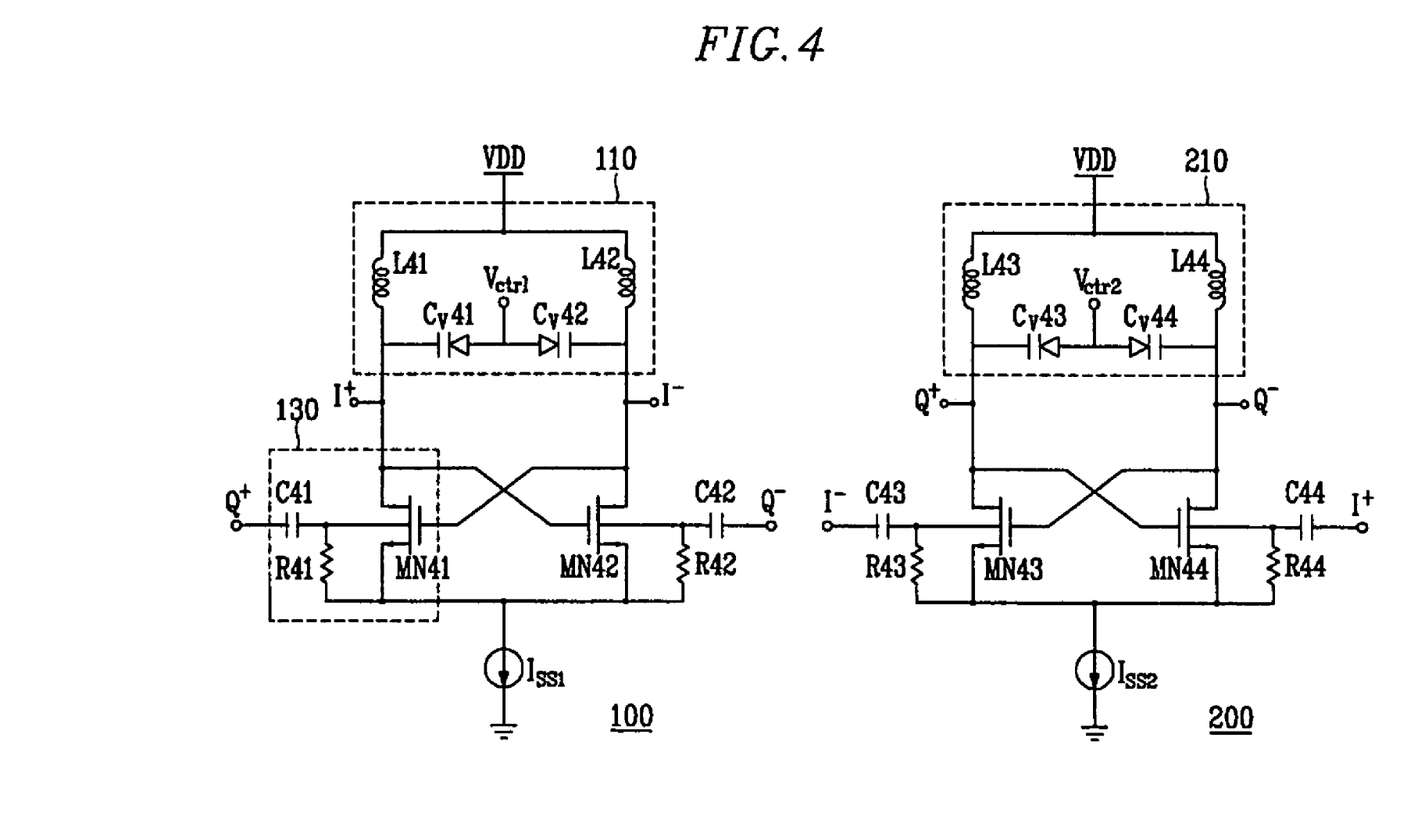
FIG. 4 shows a brief quadrature VCO according to a preferred embodiment of the present invention.

FIG. 4 shows a brief quadrature VCO according to a preferred embodiment of the present invention.

As shown, the quadrature VCO comprises a first delay cell 100 for outputting (+) and (−) in-phase signals I+ and I− which substantially have the same magnitudes and a phase difference of 90°, and a second delay cell 200 for outputting (+) and (−) quadrature-phase signals Q+ and Q− which substantially have the same magnitudes and a phase difference of 90°.

The first and second delay cells 100 and 200 are coupled to each other, the outputs signals I+ and I− of the first delay cell 100 are input to the second delay cell 200, and the outputs signals Q+ and Q− of the second delay cell 200 are input to the first delay cell 100.

Configurations of the first and second delay cells 100 and 200 will now be described in detail.

The first delay cell 100 comprises first and second switching transistors MN41 and MN42, a first LC resonance circuit 110, and a first current source Iss1.

The first and second switching transistors MN41 MN42 are cross-coupled and generate negative resistance of the VCO. In detail, a gate of the first switching transistor MN41 is coupled to a drain of the second switching transistor MN42, a drain of the first switching transistor MN41 is coupled to a gate of the second switching transistor MN42, and sources of the first and second switching transistors MN41 and MN42 are coupled to each other and are coupled to the first current source Iss1.

The first LC resonance circuit 110 comprises at least one inductor and varactor, and controls frequencies of output signals by varying impedance according to applied control voltages. The LC resonance circuit 110 can be realized by using various known circuits or by using first and second inductors L41 and L42 respectively coupled between the power source and the drains of the first and second switching transistors MN41 and MN42, and first and second varactors Cv41 and Cv42 respectively coupled between the drains of the first and second switching transistors MN41 and MN42 and the control voltage terminal Vctr1 as shown in FIG. 4.

The second delay cell 200 comprises third and fourth switching transistors MN43 and MN44, an LC resonance circuit 210, and a second current source Iss2.

The third and fourth switching transistors MN43 and MN44 are cross-coupled and generate negative resistance of the VCO. In detail, a gate of the third switching transistor MN43 is coupled to a drain of the fourth switching transistor MN44, a drain of the third switching transistor MN43 is coupled to a gate of the fourth switching transistor MN44, and sources of the third and fourth switching transistors MN43 and MN44 are coupled to each other and are coupled to the second current source Iss2.

The second LC resonance circuit 210 can be realized in a like manner of the first LC resonance circuit 110 by using known various circuits or by using third and fourth inductors L43 and L44 respectively coupled between the power source and the drains of the third and fourth switching transistors MN43 and MN44, and third and fourth varactors Cv43 and Cv44 respectively coupled between the drains of the third and fourth switching transistors MN43 and MN44 and the control voltage terminal Vctr2 as shown in FIG. 4.

The (+) and (−) quadrature-phase signals Q+ and Q− are applied to back gates of the first and second switching transistors MN41 and MN42, and (−) and (+) in-phase signals I− and I+ are applied to back gates of the third and fourth switching transistors MN43 and MN44.

That is, the first delay cell 100 outputs the (+) and (−) in-phase signals I+ and I−, and the second delay cell 200 outputs the (+) and (−) quadrature-phase signals Q+ and Q− by coupling the first and second delay cells 100 and 200 through the back gates of the switching transistors MN41 to MN44.

As shown in FIG. 4 in the preferred embodiment, first to fourth resistors R41 to R44 can be further coupled between the back gates and the sources of the first to fourth switching transistors MN41 to MN44. Also, first to fourth capacitors C41 to C44 can further be coupled to the back gates of the first to fourth switching transistors MN41 to MN44, and the (+) and (−) quadrature-phase signals Q+ and Q− and the (−) and (+) in-phase signals I− and I+ can be applied to the back gates of the first to fourth switching transistors MN41 to MN44 through the first to fourth capacitors C41 to C44.

When the resistors and the capacitors are coupled to the back gates of the switching transistors, each capacitor prevents a DC component from being applied to the back gate of the switching transistor, and each resistor controls the DC voltage applied to the back gate of the switching transistor.

Further, as will be described hereinafter, they function as a divider for reducing the magnitude of the coupling signal, thereby solving a forward bias problem which may occur when a large signal is input.

FIGS. 5a to 5d show that the signal equivalent circuit of the quadrature VCO according to the preferred embodiment of the present invention substantially corresponds to the signal equivalent circuit of the conventional quadrature VCO.

Figure 5A:
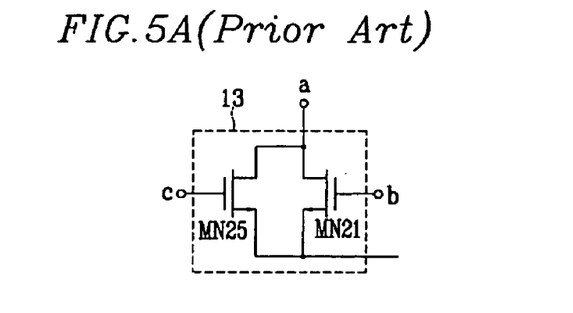
FIG. 5a shows a magnified circuit diagram of a signal coupled portion 13 of the conventional quadrature VCO shown in FIG. 2.
Figure 5B:
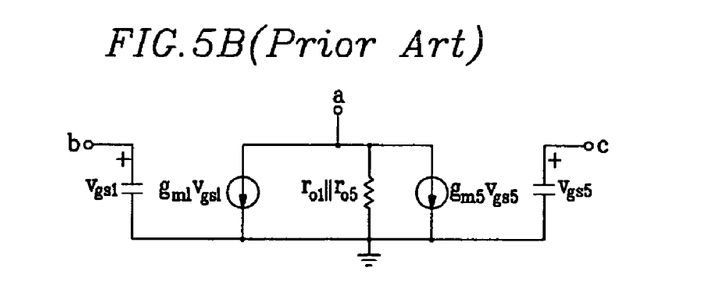

FIG. 5a shows a magnified circuit diagram of a signal coupled portion 13 of the conventional quadrature VCO shown in FIG. 2, and FIG. 5b shows a signal equivalent circuit diagram of the coupled portion 13 shown in FIG. 5a.

When a contacted point of the drains of the switching transistor MN21 and the coupling transistor MN25 is given as a node "a," the gate terminal of the switching transistor MN21 is given as a node "b," the gate terminal of the coupling transistor MN25 is given as a node "c," and transconductance of the switching transistor MN21 and the coupling transistor MN25 is respectively given as "gm1" and "gm5," the signal equivalent circuit of the coupled portion 13 is illustrated as FIG. 5b.

As shown in FIG. 5b, when signals are applied to the nodes "b" and "c" in the conventional quadrature VCO, voltages of Vgs1 and Vgs5 between the gate and the source of the switching transistor MN21 and the coupling transistor MN25 are varied, and the signal of the node "a" is accordingly varied.

Figure 5C:
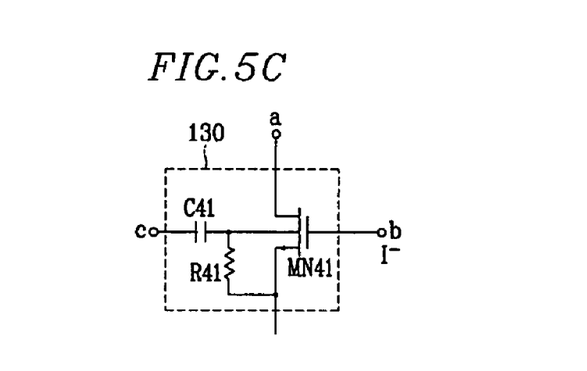
FIG. 5c shows a magnified circuit diagram of a signal coupled portion 130 of the quadrature VCO shown in FIG. 4.
Figure 5D:
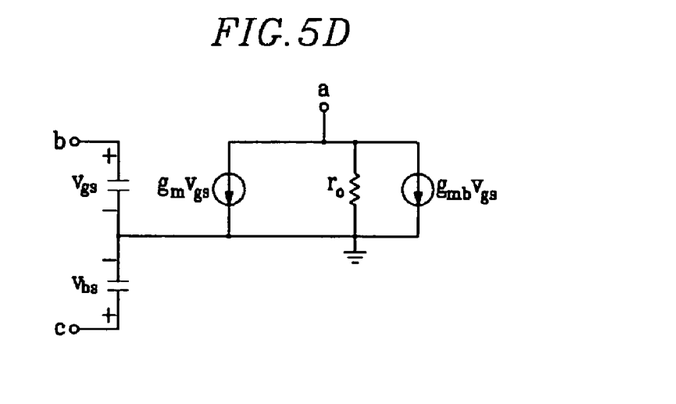
FIG. 5d shows a signal equivalent circuit diagram of the coupled portion 130 shown in FIG. 5c.

FIG. 5c shows a magnified circuit diagram of a signal coupled portion 130 of the quadrature VCO shown in FIG. 4, and FIG. 5d shows a signal equivalent circuit diagram of the coupled portion 130.

When the drain terminal of the switching transistor MN41 is given as a node "a," the gate terminal thereof is given as a node "b," another terminal of the capacitor C41 coupled to the back gate terminal is given as a node "c," and the transconductance of the switching transistor MN41 is given as "gm," the signal equivalent circuit of the coupled portion 130 is illustrated as FIG. 5d.

The capacitor C41 and the resistor R41 can be omitted in FIG. 5c since they are used for the DC components.

As shown in FIG. 5d, when signals are applied to the nodes "b" and "c" in the quadrature VCO according to the preferred embodiment, the voltage of Vgs between the gate and the source of the switching transistor MN41 and the voltage of Vbs between the back gate and the source of the switching transistor MN41 are varied, and the signal of the drain node "a" of the switching transistor is accordingly varied.

Therefore, the configuration of using two transistors MN21 and MN25 substantially corresponds to the configuration of using one switching transistor MN41 and applying the signal to the back gate when considering that the two configurations generate some differences of the influence provided to the drain by the voltage of Vgs5 between the gate and the source of the conventional coupling transistor MN25 and the voltage of Vbs between the back gate and the source of the switching transistor MN41 according to the preferred embodiment.

Hence, the first and second delay cells 100 and 200 are coupled to each other without an additional coupling transistor, and a low-noise and low-power quadrature VCO is realized.

Also, the pn junction problem which may occur in the switching transistors is solved by further using the first to fourth resistors R41 to R44 and the first to fourth capacitors C41 to C44.

In detail, the resistors R41 to R44 and the capacitors C41 to C44 coupled to the back gates of the first to fourth switching transistors MN41 to MN44 function as DC biasing of the back gate terminals, and also function as a signal divider for reducing the magnitude of the coupling signal.

Since most VCOs provide very high output voltages, when a signal with a high voltage level is applied to the back gate terminal of the switching transistor, the pn junction becomes forward-biased and may cause a problem. However, the quadrature VCO according to the preferred embodiment solves this problem since the resistors and the capacitors coupled to the back gate reduce the magnitude of the input signal.

Figure 6:
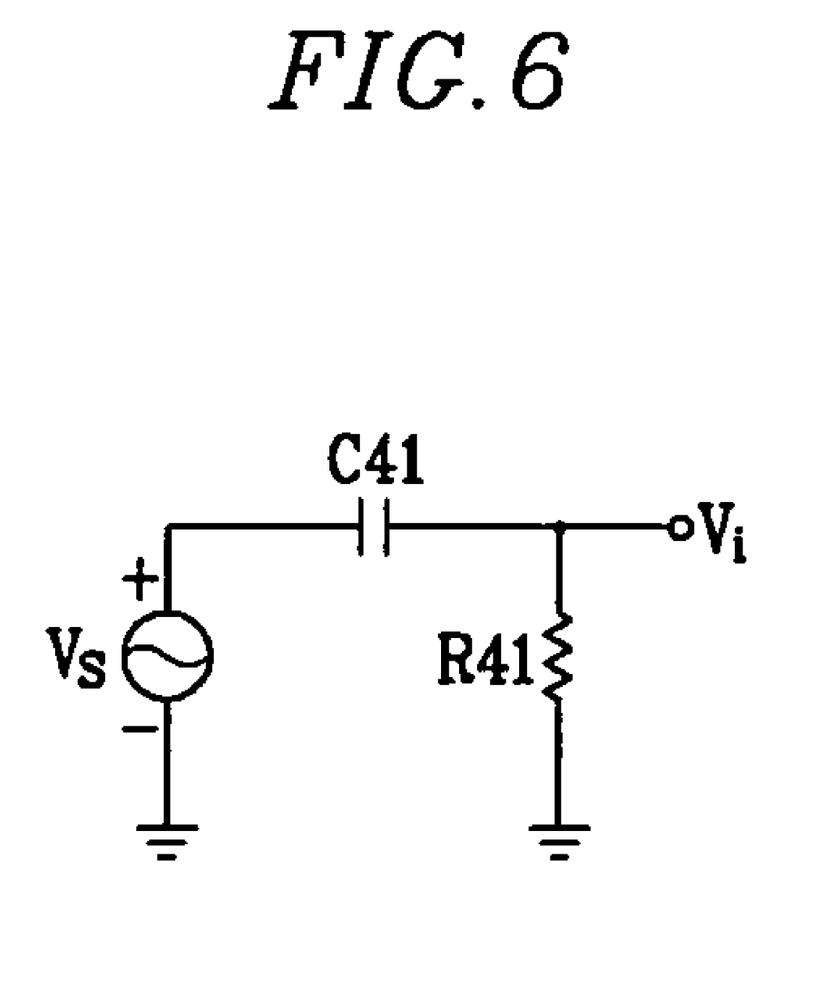
FIG. 6 shows a simplified DC biasing circuit of a back gate terminal of a switching transistor MN41 in the quadrature VCO shown in FIG. 4.

FIG. 6 shows a simplified DC biasing circuit of the back gate terminal of the switching transistor MN41 in the quadrature VCO shown in FIG. 4, where Vs is a voltage applied to one terminal of the capacitor C41, and Vi is a voltage applied to the back gate of the switching transistor MN41.

The voltage of Vs is divided to the capacitor C41 and the resistor R41, and the voltage of Vi applied to the resistor R41 is given in Equation 1.

$$V_i = \frac{R_{41}}{R_{41} + \frac{1}{jwC_{41}}} V_s \qquad \text{Equation 1}$$

As known from Equation 1, the forward bias problem which may occur when a large signal is applied is solved since the magnitude of the input signal applied to the back gate of the switching transistor is controlled according to the impedance of the capacitor C41 and the resistor R41, and the preferred embodiment is advantageous for a layout area since the capacitor C41 can have less capacitance in order to reduce the value of the voltage of Vi.

Figure 7:
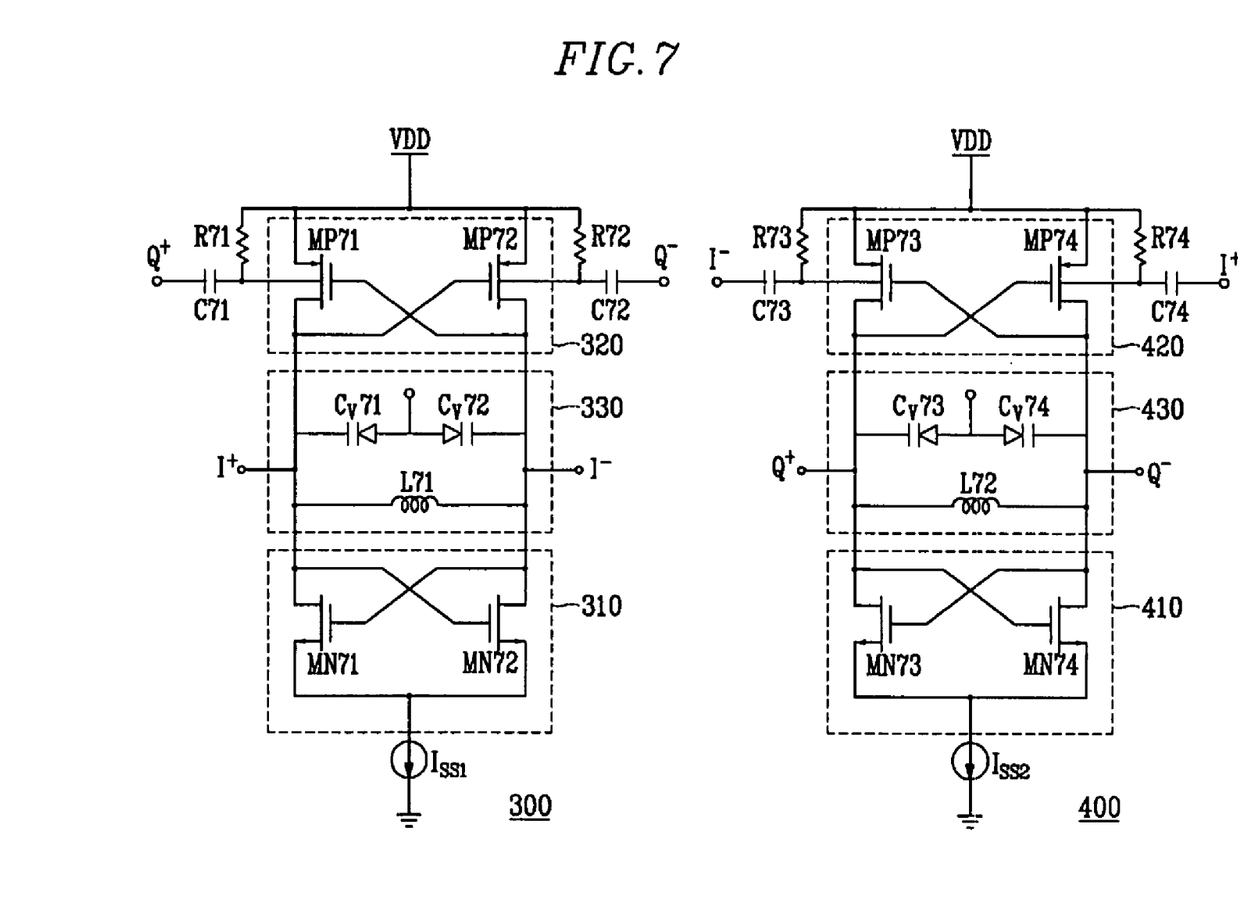
FIG. 7 shows a circuit diagram of a quadrature VCO according to a second embodiment of the present invention.

FIG. 7 shows a circuit diagram of a quadrature VCO according to a second embodiment of the present invention.

The quadrature VCO shown in FIG. 7 uses back gates of PMOS transistors to couple first and second delay cells 300 and 400 differing from the quadrature VCO shown in FIG. 4.

The quadrature VCO according to the second embodiment of the present invention will be described in detail excluding the repeated descriptions provided with reference to FIG. 4.

The first delay cell 300 comprises first and second negative resistance cells 310 and 320, an LC resonance circuit 330, and a current source Iss1.

The first negative resistance cell 310 comprises cross-coupled first and second NMOS transistors MN71 and MN72, and the second negative resistance cell 320 comprises cross-coupled third and fourth PMOS transistors MP71 and MP72.

The LC resonance circuit 330 comprises an inductor L71 and first and second varactors Cv71 and Cv72, and is coupled between the first negative resistance cell 310 and the second negative resistance cell 320.

In a like manner, the second delay cell 400 comprises first and second negative resistance cells 410 and 420, an LC resonance circuit 430, and a current source Iss2, and no detailed corresponding configuration thereof will be described so as to avoid repetition.

Output signals Q+ and Q− of the second delay cell 400 are applied to the back gates of the first and second PMOS transistors MP71 and MP72 of the first delay cell 300, and output signals I− and I+ of the first delay cell 300 are applied to the back gates of third and fourth PMOS transistors MP73 and MP74 of the second delay cell 400.

Also, in a like manner of the preferred embodiment, the first and second delay cells 300 and 400 can further comprise first to fourth capacitors C71 to C74 each having one terminal respectively coupled to the back gates of the first to fourth PMOS transistors MP71 to MP74, and other terminals to which (+) and (−) quadrature-phase signals Q+ and Q− and (−) and (+) in-phase signals I− and I+ are applied. In addition, the first and second delay cells 300 and 400 can further comprise first to fourth resistors R71 to R74 coupled between the back gates and the sources of the first to fourth PMOS transistors MP71 to MP74.

Figure 8:
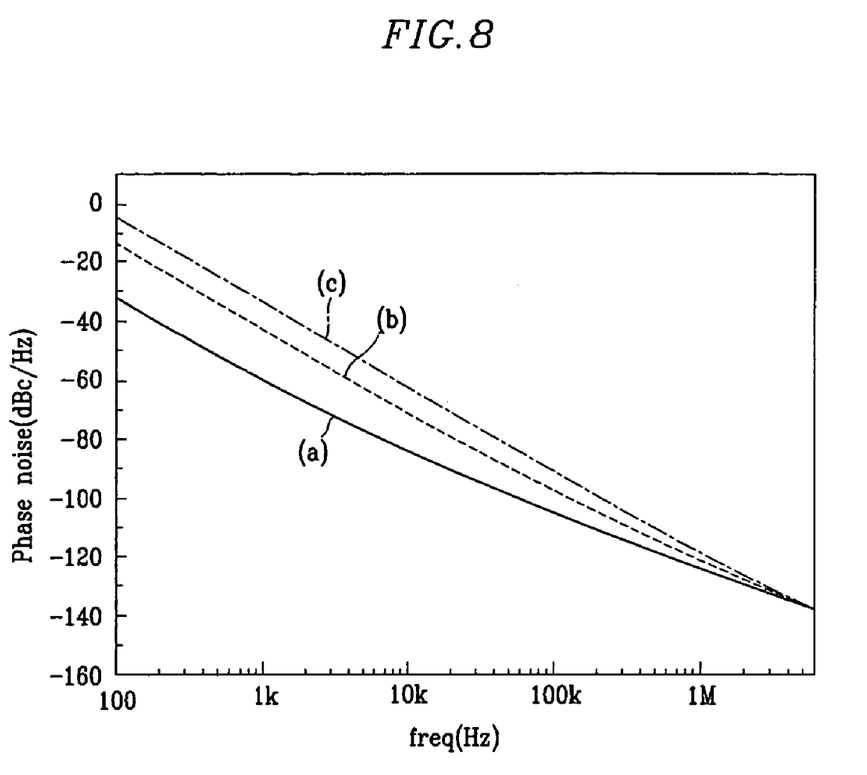
FIG. 8 shows a graph for illustrating phase noise characteristics of the differential VCO 11, the conventional quadrature VCO shown in FIG. 2, and the quadrature VCO according to the embodiment of the present invention.

FIG. 8 shows a graph for illustrating phase noise characteristics of the differential VCO 11, the conventional quadrature VCO shown in FIG. 2, and the quadrature VCO according to the embodiment of the present invention. In detail, the line (a) shows a phase noise characteristic waveform diagram of the quadrature VCO according to the preferred embodiment, the dotted line (b) shows a phase noise characteristic waveform diagram of the differential VCO, and the dotted line (c) shows a phase noise characteristic waveform diagram of the conventional quadrature VCO.

Simulation conditions for checking the phase noise characteristics are given below.

(1) 0.18 μm CMOS process
(2) Power supply of VDD: 1.8V
(3) Oscillation frequency: 1 GHz Also, the currents of 8 and 6 mA have been respectively flowed to the quadrature VCO with reference to the current of 3 mA used by the differential VCO. The quadrature VCO according to the preferred embodiment has totally used the current of 6 mA since it has two differential VCOs, and the conventional quadrature VCO has used a further current since the coupling transistor is added thereto. The reason for using the total current of 8 mA is that it is known that the current phase noise characteristic provides the best result when the size ratio of the switching transistor and the coupling transistor is 3:1.

As shown in FIG. 8, the phase noise of the quadrature VCO according to the preferred embodiment is improved by 13 dB at the frequency of 10 kHz, and 7 dB at the frequency of 100 kHz compared to the differential VCO, and it is improved by 21 dB at the frequency of 10 kHz and 14 dB at the frequency of 100 kHz compared to the conventional quadrature VCO.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

In particular, the LC resonance circuit is obvious to a person skilled in the art, and the first negative resistance cells 310 and 410 using the back gates of the PMOS elements in the second embodiment can be realized with various circuits.

Also, in order to clarify the present invention, parts which are not described in the specification are omitted, and parts for which similar descriptions are provided have the same reference numerals.

The first and second delay cells are coupled by using the back gates of the switching transistors without using the additional coupling transistor, thereby reducing the power consumption caused by the coupling transistor.

A quadrature VCO with excellent phase noise characteristics is provided since the phase noise generated by the coupling transistor is eliminated.

What is claimed is:

1. A quadrature VCO (voltage controlled oscillator) comprising a first delay cell for outputting a first in-phase signal and a second in-phase signal with a different phase from the first in-phase signal, and a second delay cell for outputting a first quadrature-phase signal and a second quadrature-phase signal with a different phase from the first quadrature-phase signal, wherein the first delay cell comprises:
a first transistor including a gate, a source, a drain for outputting the first in-phase signal, and a back gate for receiving the first quadrature-phase signal;
a second transistor including a gate, a source, a drain for outputting the second in-phase signal, and a back gate for receiving the second quadrature-phase signal, the second transistor being cross-coupled to the first transistor;
a first LC resonance circuit coupled between the drains of the first transistor and the second transistor and a first power source;
a first current source coupled between a node of the sources of the first transistor and the second transistor and a second power source;
a first capacitor connected to the back gate of the first transistor and receiving the first quadrature-phase signal; and
a second capacitor connected to the back gate of the second transistor and receiving the second quadrature-phase signal, and the second delay cell comprises:
a third transistor including a gate, a source, a drain for outputting the first quadrature-phase signal, and a back gate for receiving the second in-phase signal;
a fourth transistor including a gate, a source, a drain for outputting the second quadrature-phase signal, and a back gate for receiving the first in-phase signal, the fourth transistor being cross-coupled to the third transistor;
a second LC resonance circuit coupled between the drains of the third transistor and the fourth transistor and the first power source;
a second current source coupled between a node of the sources of the third transistor and the fourth transistor and the second power source;
a third capacitor connected to the back gate of the third transistor and receiving the second in-phase signal; and
a fourth capacitor connected to the back gate of the fourth transistor and receiving the first in-phase signal.

2. The quadrature VCO of claim 1, further comprising resistors respectively coupled between the back gates and the sources of the first to fourth transistors.

3. The quadrature VCO of claim 1, wherein the first LC resonance circuit comprises:
first and second inductors respectively coupled between the drains of the first and second transistors and the first power source; and
first and second varactors each having one terminal respectively coupled to the drains of the first and second transistors, and other grounded terminals, a control voltage for controlling frequencies of the first and second in-phase signals being applied to a node of the other terminals, and the second LC resonance circuit comprises:
third and fourth inductors respectively coupled between the drains of the third and fourth transistors and the first power source; and
third and fourth varactors each having one terminal respectively coupled to the drains of the third and fourth transistors, and other grounded terminals, a control voltage for controlling frequencies of the first and second quadrature-phase signals being applied to a node of the other terminals.

4. A quadrature VCO (voltage controlled oscillator) comprising a first delay cell for outputting a first in-phase signal and a second in-phase signal with a different phase from the first in-phase signal, and a second delay cell for outputting a first quadrature-phase signal and a second quadrature-phase signal with a different phase from the first quadrature-phase signal, wherein the first delay cell comprises:
a first negative resistance cell for generating negative resistance;
a second negative resistance cell comprising a first transistor including a gate, a source coupled to a first power source, a drain for outputting the first in-phase signal, and a back gate for receiving the first quadrature-phase signal, and a second transistor including a gate, a source, a drain for outputting the second in-phase signal, and a back gate for receiving the second quadrature-phase signal, the second transistor being cross-coupled to the first transistor;
a first LC resonance circuit coupled between the first and second negative resistance cells; and
a first current source coupled between the first negative resistance cell and a second power source;
a first capacitor connected to the back gate of the first transistor and receiving the first quadrature-phase signal; and
a second capacitor connected to the back gate of the second transistor and receiving the second quadrature-phase signal, and the second delay cell comprises:
a third negative resistance cell for generating negative resistance;
a fourth negative resistance cell comprising a third transistor including a gate, a source coupled to the first power source, a drain for outputting the first quadrature-phase signal, and a back gate for receiving the second in-phase signal, and a fourth transistor including a gate, a source, a drain for outputting the second quadrature-phase signal, and a back gate for receiving the first in-phase signal;
a second LC resonance circuit coupled between the third and fourth negative resistance cells;

a second current source coupled between the third negative resistance cell and the second power source;

a third capacitor connected to the back gate of the third transistor and receiving the second in-phase signal; and a fourth capacitor connected to the back gate of the fourth transistor and receiving the first in-phase signal.

5. The quadrature VCO of claim 4, further comprising resistors respectively coupled between the back gates and the sources of the first to fourth transistors.

6. A quadrature VCO (voltage controlled oscillator) comprising:

a first delay cell including a first transistor and a second transistor, the first delay cell outputting a first in-phase signal and a second in-phase signal with a different phase from the first in-phase signal; and a second delay cell including a third transistor and a fourth transistor, the second delay cell outputting a first quadrature-phase signal and a second quadrature-phase signal with a different phase from the first quadrature-phase signal, and wherein the first in-phase signal is applied to a first capacitor connected to a back gate of the fourth transistor, the second in-phase signal is applied to a second capacitor connected to a back gate of the third transistor, the first quadrature-phase signal is applied to a third capacitor connected to a back gate of the first transistor, and the second quadrature-phase signal is applied to a fourth capacitor connected to a back gate the second transistor.

* * * * *